United States Patent [19]

Morton, Jr.

[11] Patent Number: 4,928,934
[45] Date of Patent: May 29, 1990

[54] POSITIVE RETENTION CHIP CARRIER

[75] Inventor: William D. Morton, Jr., Santa Clara, Calif.

[73] Assignee: Precision Monolithics, Inc., Santa Clara, Calif.

[21] Appl. No.: 386,562

[22] Filed: Jul. 27, 1989

Related U.S. Application Data

[63] Continuation-in-part of Ser. No. 263,370, Oct. 27, 1988, abandoned.

[51] Int. Cl.$^5$ ............................................. B65D 73/02
[52] U.S. Cl. ..................................... 206/328; 206/560
[58] Field of Search ................ 206/328, 330, 331, 560

[56] References Cited

U.S. PATENT DOCUMENTS

| | | | |
|---|---|---|---|
| 1,114,998 | 10/1914 | Love | 206/560 |
| 4,379,505 | 4/1983 | Alemanni | 206/560 |
| 4,549,651 | 10/1985 | Alemanni | 206/560 |
| 4,620,632 | 11/1986 | Alemanni | 206/560 |
| 4,793,479 | 12/1988 | Otsuka et al. | 206/560 |

*Primary Examiner*—Joseph Man-Fu Moy
*Attorney, Agent, or Firm*—Koppel & Jacobs

[57] ABSTRACT

A carrier for an integrated circuit (IC) can has a plurality of low profile symmetrically distributed flexible arms extending from the carrier base with small hook projections for engaging a flange on the perimeter of the can. The low arm profile enables information to be printed on the side of the can while it is in the carrier. The symmetrical distribution of the flexible arms imparts an even load upon the can to prevent bending of the leads. The carrier base has round holes for receiving electrical leads projecting from the can to minimize the scraping of the leads during insertion and removal of the can from the carrier.

13 Claims, 2 Drawing Sheets

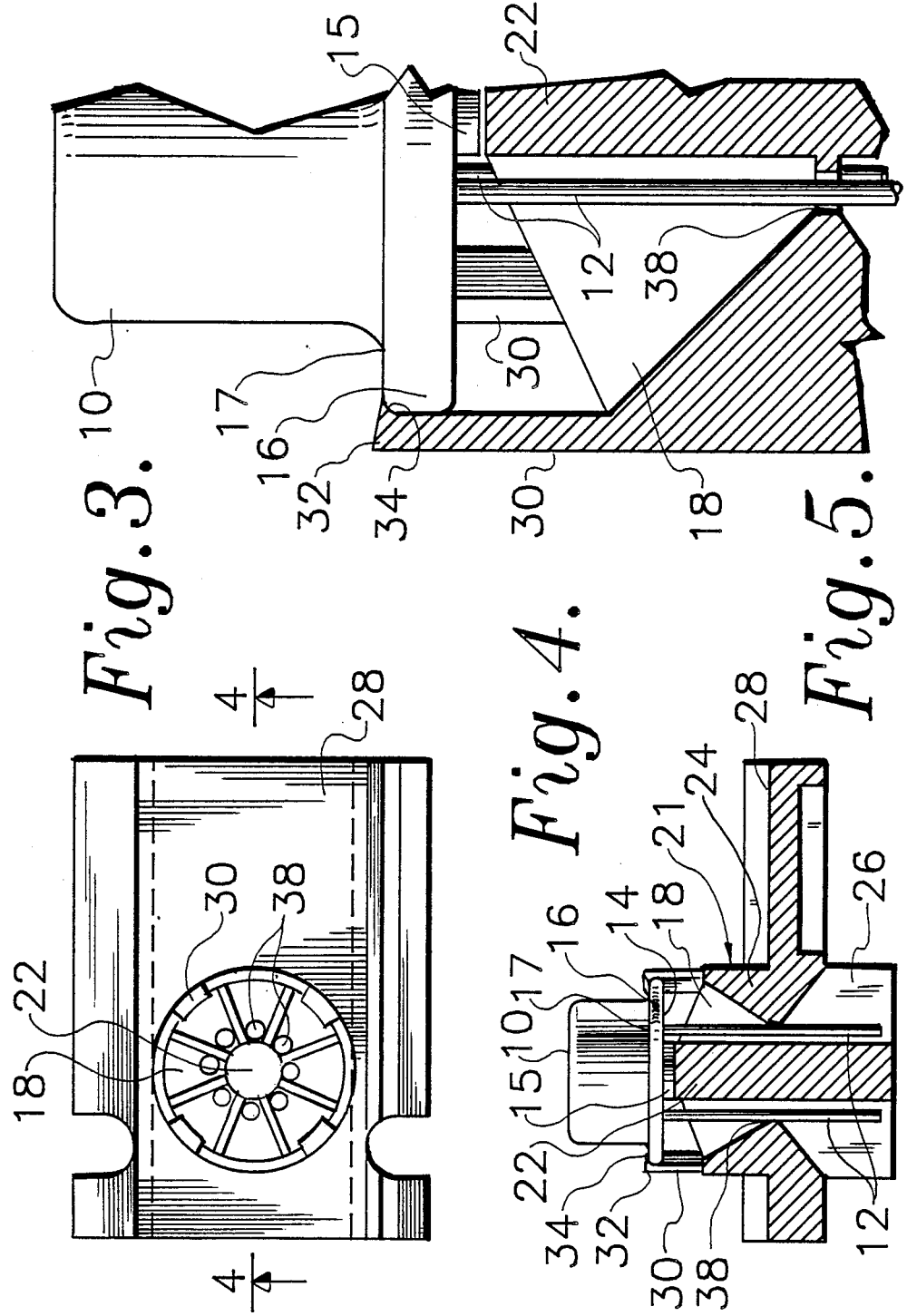

POSITIVE RETENTION CHIP CARRIER

RELATED APPLICATION

This application is a continuation-in-part of Ser. No. 07/263,370, filed Oct. 27, 1988, now abandoned the benefit of which is claimed.

BACKGROUND OF THE INVENTION

1. Field of the Invention

This invention relates to a carrier for retaining an integrated circuit (IC) chip in place during final manufacturing and testing of the chip. More particularly, it relates to a carrier for an IC chip having a cylindrical can body with a number of electrical leads projecting from the bottom of the can in a circular pattern.

2. Description of the Prior Art

Carrier devices are known for integrated circuit (IC) chip cans wherein the electrical leads projecting from the bottom of the can extend through D-shaped holes in the base of the carrier. These holes retain the leads in place. However, the use of such D-shaped holes results in bending or scraping of the soft solder electrical leads during manual or machine insertion and removal of the can from the carrier.

Other carrier devices are known in which a single arm extending from the carrier is snapped over a flange on the lower perimeter of the can to keep it in place. FIG. 1 is a cross-sectional view of a typical prior art carrier for a can-type IC chip having such a single arm. In FIG. 1 an IC can 10 has electrical leads 12 extending from its lower end 14, a stand-off 15 projecting from its lower end, and a flange 16 on the perimeter of lower end 14. Can 10 is retained in the carrier by a single flexible arm 18 having a hook 19 on its arm end 20 projecting therefrom that engages flange 16. Leads 12 are received by holes 13 in a tapered section 18 and in a base 21. A tapered first section 18 projects from base 21 and has a flat top end 22 upon which stand-off 15 of can 10 sits. Base 21 has an upper cylindrical base section 24 and a lower cylindrical base section 26. A platform 28 attached to base 21 at the junction of upper base section 24 and lower base section 26 is used to stabilize the carrier during manufacturing and testing procedures.

A major disadvantage with carriers like the one depicted in FIG. 1 is that single flexible arm 18 places an unbalanced load on can 10, causing the soft solder leads 12 to bend. Leads 12 normally are in a circular pattern that is concentric to the circumference of cylindrical can 10. Prior art devices bend these leads and thus disrupt this concentricity. After the can has been removed from the carrier, the leads typically must be laboriously, manually straightened to reestablish this concentricity before the can may be used in other operations.

A second disadvantage of such prior art devices like the one depicted in FIG. 1 is that flexible arm 18 extends too far above the upper surface 17 of flange 16 and thereby obscures a portion of the can body so that identifying information cannot be printed on the side of can 10 while it is in the carrier.

Other IC chip carriers are known for flat pack or DIP chips. In U.S. Pat. No. 4,379,505 issued Apr. 12, 1983 to Alemanni, and U.S. Pat. No. 4,591,053 issued May 27, 1986 to Alemanni, four resilient retaining fingers are used to retain the flat pack by contacting its outermost leads. The disadvantage of this approach is that it may bend or otherwise harm the soft leads.

U.S. Pat. No. 3,746,157 issued July 17, 1973 to L'Anson discloses a carrier for retaining a flat pack using a snap-in retaining clip, the underside of which is plated with a conductor material such as aluminum. When the retaining clip is in place, this undersurface bridges the conductors of the flat pack, shorting them to one and other. Of course, this approach is not suitable for operations where the leads should not be shorted.

Other carriers are known for retaining flat packs and DIPs. See U.S. Pat. No. 4,556,145 issued Dec. 3, 1985 to Putnam; U.S. Pat. No. 3,892,312 issued July 1, 1975 to Tems; and U.S. Pat. No. 3,652,974 issued Mar. 28, 1972 also to Tems. However, none of these carriers is suitable for retaining a cantype body.

SUMMARY OF THE INVENTION

It is a feature of the present invention to provide an IC chip carrier for a cylindrical can that eliminates the scraping of the soft solder leads of the chip during insertion and removal of the chip from the carrier.

It is another feature of the present invention to provide an IC chip carrier for a can that eliminates the bending of the soft solder electrical leads of the chip while the chip is retained in the carrier and retains the concentricity of the circular lead pattern with the circumference of the can.

It is yet another feature of the present invention to provide an IC chip carrier which allows information to be printed on the side of the can while it is retained in the carrier.

It is yet another feature of the present invention to provide an IC chip carrier that securely retains the chip during manufacturing and testing operations.

These and other features and advantages of the present invention are accomplished in a carrier for an integrated circuit can of the type having a flange on the perimeter of its lower end and a plurality of electrical leads projecting from the lower end. The carrier includes a base and a first section projecting from the base with a flat top end and a plurality of holes that receive the plurality of electrical leads. The first section may have a variety of shapes, including a conical or pyramid shape. A stand-off on the lower end of the can rests on the flat top of the first section. The base includes an upper cylindrical section and a lower cylindrical section, both sections having a plurality of substantially round holes therein that accept the electrical leads. The round holes are preferably distributed in a circular pattern that matches the pattern in the holes in the first section and the circular lead pattern. A substantially flat platform is attached to the base at the junction of the upper and lower cylindrical base sections, and is used for stabilizing the carrier during manufacturing and testing procedures.

At least three stiffly flexible arms project from the upper cylindrical base section and engage the can flange to hold the can in place. The arms are arranged in a symmetrical configuration to provide an even load upon the can. This even load retains the concentricity between the circular pattern of the leads and the circumference of the cylindrical can so that the leads are not bent or scraped during insertion or removal of the can from the carrier, and during the time that the can is retained in the carrier. Each of the flexible arms has an arm end that engages the flange when the can is positioned in the carrier. The arm ends have respective hook projections for engaging the flange.

Due to the opposed flexing of the plural arms the hooks can be quite small, extending only about 0.005-0.01 inch. This allows for a low taper at the upper end of the arms and hooks which is still adequate for the can to flex the arms back for insertion or removal. The low taper in turn results in a low upper arm profile which avoids substantial obstruction to the placement of printed information on the can while the can is retained in the carrier.

These and other features and advantages of the invention will be apparent to those skilled in the art from the following detailed description of preferred embodiments, taken together with the accompanying drawings, in which:

DESCRIPTION OF THE DRAWINGS

FIG. 3 is a top view of a carrier according to the present invention;

FIG. 4 is a cross-section of the carrier depicted in FIG. 3, taken along line 4—4; and FIG. 5 is an enlarged view of the flexible arm according to the present invention.

DETAILED DESCRIPTION OF PREFERRED EMBODIMENTS

Figure 2:
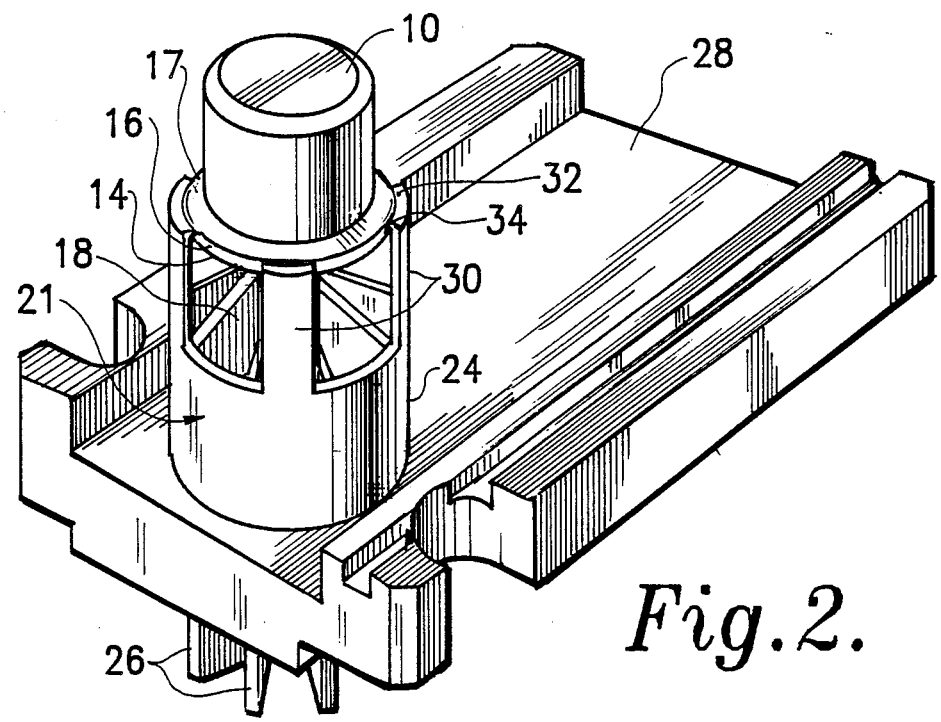
FIG. 2 is a perspective view of a carrier according to the present invention.

FIG. 2 is a perspective view of an integrated chip (IC) carrier according to the present invention. In FIG. 2, an IC can 10 has electrical leads 12 extending from its lower end 14 in a circular arrangement that is concentric with the circumference of cylindrical can 10. Can 10 also has a flange 16 on the circumference or perimeter of its lower end 14. Can 10 is retained in the carrier by a plurality of stiffly flexible arms 30, each of which has an arm end 32 and a hook 34 projecting from arm end 32 for engaging flange 16. Hook 34 engages flange 16 to retain the can in the carrier.

Figure 1:
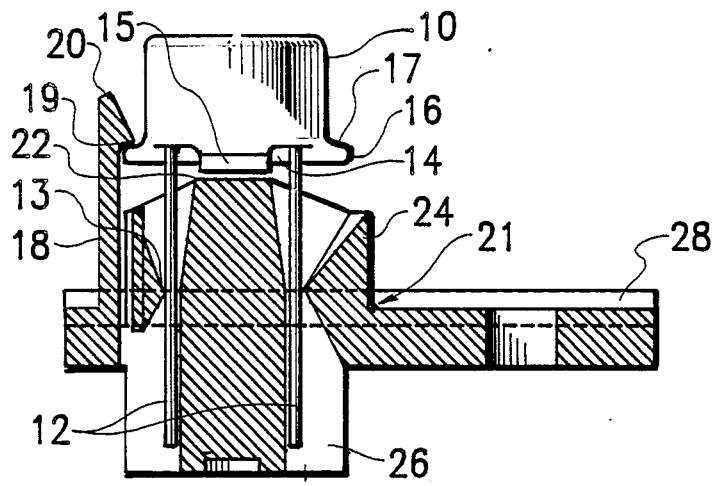
FIG. 1 is a cross-section of a typical prior art carrier for an IC can-type chip.

Flexible arms 30 are symmetrically arranged around the circumference of can 10 to impart an even load upon can 10 when the can is retained in the carrier. Three or more arms 30 may be used to engage flange 16, as long as they are symmetrically distributed around the circumference of the can. This symmetrical distribution of the forces imparted on the can by arms 30 minimizes the bending of electrical leads 12 while the can is in the carrier. The concentricity between the circular lead pattern and the outer circumference of the can is thereby retained, obviating the laborious manual process of straightening the bent leads after the can is removed from a prior art IC chip carrier that imparts an uneven load upon the can, like the carrier depicted in FIG. 1. The arms are positioned along a circle slightly smaller than the IC cap flange 16, causing the arms to be somewhat flexed outward when a cap is in place. The arms are thus flexed in opposition to each other and bear against the flange of an IC can inserted between them.

Referring again to FIG. 2, leads 12 are received by holes 13 (not shown) in a tapered first section 18 and in a base 21. Tapered section 18 projects from base 21 and has a flat top end 22 (not shown) upon which rests a stand-off 15 (not shown) attached to lower end 14 of can 10. Base 21 has an upper cylindrical base section 24 and a lower cylindrical base section 26. A flat platform 28 attached to base 21 at the junction of upper base section 24 and lower base section 26 is used to stabilize the carrier during manufacturing and testing procedures.

FIG. 3 depicts a top view of an IC chip carrier according to the present invention. In FIG. 3 four arms 30 project from the base and are symmetrically arranged to impart an even load upon the can (not shown). For a typical IC can held in place by 4 arms, the opposing arms 30 are about 0.350-0.360 inches apart, with 0.360 inches being a preferred distance. Tapered first section 18 has a flat top end 22. Tapered section 18 has a plurality of round holes 38 distributed in a circular pattern for receiving the electrical leads projecting from the lower end of the can. Holes 38 can be round, unlike the D-shaped holes required in prior art devices to minimize the bending and scraping of the soft solder leads during insertion and removal of the can from the carrier.

FIG. 4 is a cross-sectional view of the carrier depicted in FIG. 3, taken along line 4—4. In FIG. 4, electrical leads 12 projecting from the lower end 14 of can 10 are received by a plurality of holes 38 in tapered first section 18, upper cylindrical base section 24, and lower cylindrical base section 26. Stand-off 15 projecting from the lower end 14 of can 10 sits upon the flat top end 22 of tapered section 18 when can 10 is retained in the carrier. First section 18 may be of a variety of shapes, including a cone or a pyramid.

FIG. 4 depicts another important feature of the present invention, namely that arms 30 are designed to have a low profile so that their arm ends 32 do not extend substantially above the upper surface 17 of flange 16. With the prior art carrier of FIG. 1, the single retention arm 18 requires a relatively large overlap of its hook 19 on the can flange, on the order of 0.05 inch, to assure that the can is held firmly in place. With such a projection into the can area, the arm must be flexed backward a relatively long distance to alloW the can to be inserted. This flexing is accomplished by providing a tapered surface on the upper portion of the hook; the can flange bears against the tapered surface as the can is inserted and flexes the arm backward. To accommodate this relatively high degree of flexing, the tapered surface is established at an angle of about 45° to the arm axis. This degree of taper, together with the relatively long projection of hook 19 referred to above, results in the previously noted problem of a high arm profile that prevents identifying markings from being printed on the can while it is in the carrier. The top of the arm typically rises about 0.1 inch above the can flange, while the height of the can itself above the flange is typically only about 0.125 inch.

In a preferred embodiment of the invention, the arm end 32 extends less than about 0.02 inches above the upper surface of flange 16, with 0.003 inches being the preferred distance. This low profile permits information to be printed on the side of a can while the can is retained in carrier.

The shape of flexible arms 30 is more clearly shown in FIG. 5. In FIG. 5 a flexible arm 30 engages flange 16 of can 10 by means of arm end 32 having a hook 34 projecting therefrom. Since the can is held between a plurality of symmetrically positioned and flexed arms, only a small projection is required for hook 34 to hold the can in place. This projection is about 0.005-0.01 inches; 0.005 inch is about the minimum projection necessary to account for can tolerances, While above 0.01 inch it becomes difficult to insert or remove the can. With this small projection, the arms do not have to be flexed back very far when a can is inserted or removed. This in turn has been found to permit a considerably lower taper than in the prior carrier of FIG. 1. The upper surface of arm end 32 is preferably coplanar in a continuous terminal surface with the upper surface of hook 34, at an angle greater than about 65° and preferably about 75° to the axis of arm 30. This results in the low rise profile, described above, which leaves most of the can surface exposed for printing while the can is still in the carrier.

Hook 34 may have a variety of shapes as long as it retains the desired low profile. In a preferred embodiment, it has the approximate shape of an isosceles triangle, with the upper surface of arm end 32 at an angle greater than about 65° and preferably about 75° to the axis of the arm.

While particular embodiments of the invention have been shown and described, numerous modifications and alternate embodiments will occur to those skilled in the art. Accordingly, it is intended that the invention be limited only by the following claims.

I claim:

1. A carrier for an integrated circuit (IC) can, said can having a lower end, a plurality of electrical leads extending from the lower end, a stand-off projecting from the lower end, a flange around the perimeter of the lower end, said flange having an upper surface, and a surrounding wall extending upward from the flange, the carrier comprising:
   a base having a plurality of openings to receive said plurality of leads;
   a support section projecting from the base, the support section having a top end for supporting the stand-off and a plurality of openings to receive said plurality of leads; and
   at least three stiffly flexible arms projecting from the base and arranged in a generally symmetrical configuration to flex in opposition to each other and bear against the flange of an IC can inserted therebetween, the end of each arm having an inward projection with a lower surface which lodges against the upper flange surface of an IC can inserted between the arms to retain the can in the carrier, said projections extending inwardly from their respective arms by about 0.005–0.01 inch, said projections being tapered so that said arms terminate not more than about 0.02 inches above said lower projection surfaces, whereby substantially the entire surface of said surrounding wall is exposed for printing and said arms avoid substantial obstruction to the placement of printed information on said surrounding wall while the can is retained in the carrier, said projections bearing against the flange of an IC can when the can is inserted between said arms to flex said arms backward to admit the IC can.

2. The carrier of claim 1, said projections having upper surfaces which are coplanar in a continuous terminal surface with the upper ends of their respective arms.

3. The carrier of claim 2, said terminal surfaces being disposed at an angle of at least 65° to the axes of their respective arms.

4. The carrier of claim 3, said terminal surfaces being disposed at an angle of about 75° to the axes of their respective arms.

5. The carrier of claim 4, wherein each inward arm projection converges to a terminus at a convergence angle of about 30°.

6. The carrier of claim 1, wherein said openings are substantially round.

7. The carrier of claim 1, wherein said support section is substantially conical in shape.

8. The carrier of claim 1, wherein said support section is a pyramid.

9. A carrier for an integrated circuit (IC) can, said can having a flange around its perimeter with an upper surface, and a surrounding wall extending upward from the flange, comprising:
   a base, and
   at least three stiffly flexible arms projecting from the base and arranged in a generally symmetrical configuration to flex in mutual opposition to each other and bear against an IC can inserted therebetween, the end of each arm being tapered and having an inward projection with a lower surface which lodges against the upper flange surface of an IC can inserted between the arms to retain the can in the carrier, said projections extending inwardly from their respective arms by about 0.005–0.01 inch, said projections being tapered so that said arms terminate not more than about 0.02 inches above said lower projection surfaces, whereby substantially the entire surface of said surrounding wall is exposed for printing and said arms avoid substantial obstruction to the placement of printed information on said surrounding wall while the can is retained in the carrier, said projections bearing against the flange of an IC can when the can is inserted between said arms to flex said arms backward to admit the IC can.

10. The carrier of claim 9, said projections having upper surfaces which are coplanar in respective continuous terminal surfaces with the upper ends of their respective arms.

11. The carrier of claim 10, said terminal surfaces being disposed at an angle of at least 65° to the axes of their respective arms.

12. The carrier of claim 11, said terminal surfaces being disposed at an angle of about 75° to the axes of their respective arms.

13. The carrier of claim 12, wherein each inward arms projection converges to a terminus at a convergence angle of about 30°.

* * * * *